(12) United States Patent
Cho et al.

(10) Patent No.: US 10,714,675 B2
(45) Date of Patent: Jul. 14, 2020

(54) PIEZOELECTRIC DEVICE AND METHOD OF FABRICATING THE SAME

(71) Applicant: UNIVERSITY-INDUSTRY FOUNDATION (UIF), YONSEI UNIVERSITY, Seoul (KR)

(72) Inventors: Yong Soo Cho, Seoul (KR); Chan Su Han, Gyeonggi-do (KR)

(73) Assignee: UNIVERSITY-INDUSTRY FOUNDATION (UIF), YONSEI UNIVERSITY, Seoul (KR)

( * ) Notice: Subject to any disclaimer, the term of this patent is extended or adjusted under 35 U.S.C. 154(b) by 300 days.

(21) Appl. No.: 15/697,692

(22) Filed: Sep. 7, 2017

(65) Prior Publication Data

US 2018/0069167 A1  Mar. 8, 2018

(30) Foreign Application Priority Data

Sep. 7, 2016  (KR) .................. 10-2016-0115264

(51) Int. Cl.
| | |
|---|---|
| H01L 41/08 | (2006.01) |
| H02N 2/18 | (2006.01) |
| H01L 41/047 | (2006.01) |
| H01L 41/113 | (2006.01) |
| H01L 41/314 | (2013.01) |
| H01L 41/332 | (2013.01) |
| H01L 41/187 | (2006.01) |
| H01L 41/193 | (2006.01) |

(52) U.S. Cl.
CPC ........ *H01L 41/081* (2013.01); *H01L 41/0477* (2013.01); *H01L 41/113* (2013.01); *H01L 41/314* (2013.01); *H01L 41/332* (2013.01); *H02N 2/18* (2013.01); *H02N 2/186* (2013.01); *H01L 41/1871* (2013.01); *H01L 41/1876* (2013.01); *H01L 41/193* (2013.01)

(58) Field of Classification Search
CPC . H01L 41/081; H01L 41/0477; H01L 41/113; H01L 41/0831; H01L 41/1136; H01L 41/083; H02N 2/186; H02N 2/18
See application file for complete search history.

(56) References Cited

U.S. PATENT DOCUMENTS

| | | | | |
|---|---|---|---|---|
| 2009/0064476 A1* | 3/2009 | Cross | .................... | H01L 41/083 29/25.35 |
| 2013/0154439 A1* | 6/2013 | Lee | ........................ | H02N 2/188 310/314 |
| 2014/0167564 A1* | 6/2014 | Hwang | .................... | H02N 2/18 310/339 |
| 2014/0203707 A1* | 7/2014 | King | ........................ | H01J 9/02 315/111.81 |
| 2015/0084486 A1* | 3/2015 | Eguchi | ................ | H01L 41/1876 310/360 |
| 2016/0344308 A1* | 11/2016 | Wang | ....................... | H02N 1/04 |

* cited by examiner

*Primary Examiner* — Bryan P Gordon

(57) ABSTRACT

Provided are a piezoelectric device and a method of fabricating the same and the piezoelectric device may include a substrate including a 3-dimensional pattern surface layer; and a piezoelectric material layer, which is formed on the pattern surface layer and forms a 3-dimensional interface with the pattern surface layer.

19 Claims, 16 Drawing Sheets

MAGNETIC FILED INCREASES

Dot size: 10~30 nm

Dot size: 40~65 nm

Dot size: 70~100 nm

ND METHOD
PIEZOELECTRIC DEVICE AND METHOD OF FABRICATING THE SAME

CROSS-REFERENCE TO RELATED APPLICATION

This application claims priority of Korean Patent Application No. 10-2016-0115264, filed on Sep. 7, 2016, in the KIPO (Korean Intellectual Property Office), the disclosure of which is incorporated herein entirely by reference.

BACKGROUND OF THE INVENTION

Field of the Invention

The present disclosure relates to an energy harvesting device, and more particularly, to energy harvesting device using a piezoelectric device.

Description of the Related Art

Electrical energy may be obtained from various sources, such as hydroelectric power, fossil fuel, or nuclear fuel, and may be stored in an energy storage device, such as a battery. Since an amount of the sources of electric energy is limited and pollutants is generated during an electrical power generation process, there is a growing interest in alternative energy sources that are less likely to be depleted and are environment-friendly. Energy harvesting techniques for converting an energy obtained from natural alternative energy sources, such as sunlight, vibration, heat, and wind power, into electric energy, and harvesting the electric energy are attracting attention.

In recent years, the energy harvesting techniques have been suggested as a promising solution for electrical power source for small electronic devices for example, small electric motor, low powered sensor and wearable devices etc. Among the energy harvesting techniques, an energy harvesting technique using vibration energy may extract electrical energy from consumptive mechanical energy generated from environmental minute vibrations or minute movements of human body.

As techniques for using converting the above-stated vibration energy into electrical energy, there are techniques using an electrostatic effect, an electromagnetic effect, or a piezoelectric effect. Here, a technique using the piezoelectric effect exhibits so high conversion efficiency that it may be suitable for small and lightweight device, such as an energy harvester, piezoelectric sensors, an acceleration sensor, an acoustic emission (AE) sensor, an impact sensor, and a knocking sensor, and a wireless mobile small electronic device. Particularly, when a mechanical energy generating periodic vibration is converted into electrical energy through the piezoelectric effect, a cantilever-type structure in which one end is fixed and the other end is free may be utilized.

However, in a conventional piezoelectric device having the cantilever-type structure, a deformation of the piezoelectric device due to an external force may be induced only locally. For example, the deformation of the piezoelectric device may occur only at the fixed end or the free end of the cantilever-type structure. As a result, the conventional piezoelectric devices exhibit low energy output in contrast to the overall volume.

SUMMARY OF THE INVENTION

Provided is a piezoelectric device with improved energy conversion efficiency in contrast to the overall volume.

Provided is a method of fabricating a piezoelectric device having the above-stated advantage.

Additional aspects will be set forth in part in the description which follows and, in part, will be apparent from the description, or may be learned by practice of the presented embodiments.

According to an aspect of an embodiment, a piezoelectric device includes a substrate including a 3-dimensional pattern surface layer; and a piezoelectric material layer, which is formed on the pattern surface layer and forms a 3-dimensional interface with the pattern surface layer. The piezoelectric device may have a cantilever-type structure. The substrate may include a solid polymer, silicon, ceramic, a metal, or a combination thereof. The 3-dimensional pattern surface layer may include an array of embossed shapes, dome shapes, dot shapes, trench shapes, hemisphere shapes, pyramid shapes, concavo-convex shapes, zigzag shapes, wave shapes, or mixed shapes thereof. A ratio of a surface area $A_{pat}$ of the 3-dimensional pattern surface layer to a surface area $A_{sub}$ of a virtual plane of the substrate may satisfy $1 < A_{pat}/A_{sub} \leq 10$. The piezoelectric material layer may include a piezoelectric ceramic containing lead zirconate titanate (PZT, $Pb[Zr_xTi_{1-x}]O_3$, $0<x<1$), barium titanate (BTO, $BaTiO_3$), lead magnesium niobate-lead titanate (PMN-PT), lead zinc niobate-lead titanate (PZN-PT), BaNi-$TiO_3$ (BNT), barium zirconate titanate-barium calcium titanate (BZT-BCT), lead magnesium niobate-lead zirconate titanate (PMN-PZT), ZnO, AlN, or a mixture thereof. The piezoelectric material layer may include a piezoelectric polymer containing polyvinylidene fluoride (PVDF), polyvinylenedifluoride-tetrafluoroethylene (PVDF-TrFE), P(VDF-TrFE-CFE), P(VDF-TrFE-CTFE), electron-irradiated P(VDF-TrFE), or a mixture thereof. The piezoelectric material layer may have a thickness from about 0.1 µm to about 10 µm.

According to another embodiment of the present invention, the piezoelectric device may further include a first electrode layer between the pattern surface layer and the piezoelectric material layer; and a second electrode layer, which is disposed on the piezoelectric material layer and faces the first electrode layer. The piezoelectric device may further include a buffer layer between the pattern surface layer and the first electrode layer. The buffer layer may include Ti, W, Pt, Au, Mo, Ni, $TiO_2$, Cr, or a mixture thereof.

According to an aspect of another embodiment, a method of fabricating a piezoelectric device, the method includes providing a substrate; forming a 3-dimensional pattern surface layer on the substrate; and forming a piezoelectric material layer, which forms a 3-dimensional interface with the pattern surface layer, on the pattern surface layer. The forming of the 3-dimensional pattern surface layer may include forming a metal layer on the substrate; providing fluidity to the metal layer by applying heat energy to the metal layer; and forming the 3-dimensional metal pattern surface layer 11 by applying a magnetic field to the metal layer having fluidity. The metal layer may include Fe, Ni, Co, or a mixture thereof. In the forming of the 3-dimensional pattern surface layer, the 3-dimensional pattern surface layer may be formed in a surface of the substrate by etching the surface of the substrate. The piezoelectric device may include at least one of a piezoelectric energy harvester and a piezoelectric sensor.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1A:
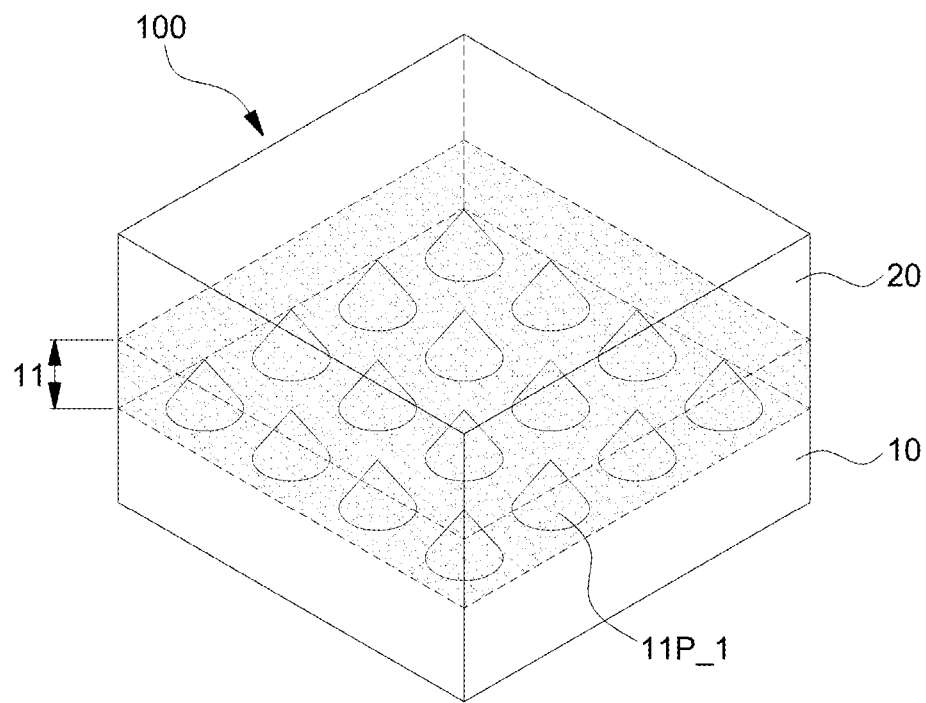
FIGS. 1A and 1B are cross-sectional views of piezoelectric devices according to various embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

Figure 1B:
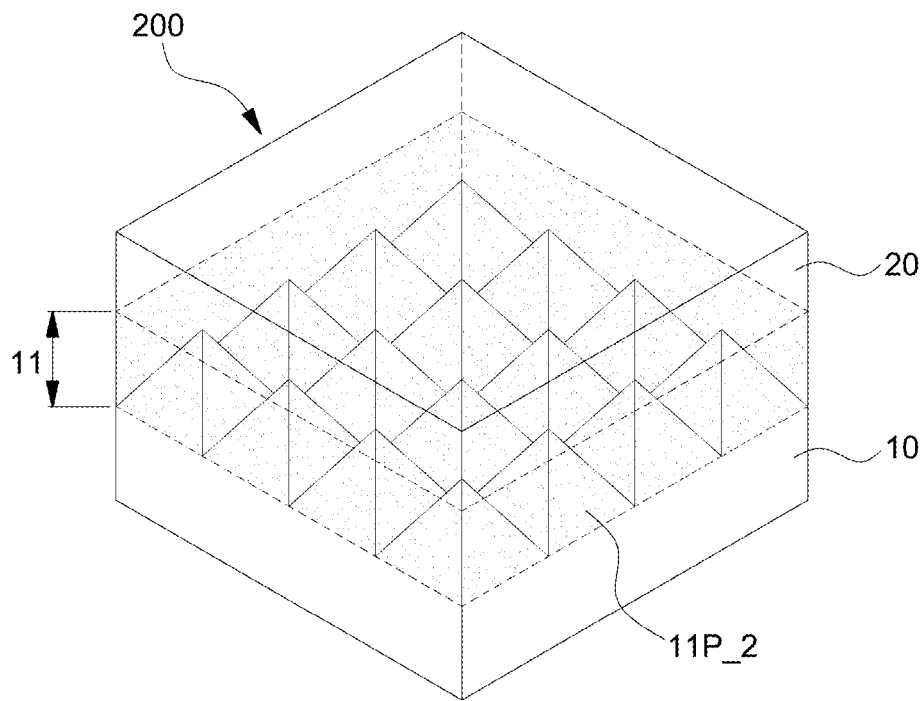

FIGS. 1A and 1B are cross-sectional views of piezoelectric devices 100 and 200 according to various embodiments of the present invention.

Referring to FIG. 1A, a piezoelectric device 100 may be an energy harvesting device or a piezoelectric sensor, such as an acceleration sensor, an acoustic emission (AE) sensor, an impact sensor, or a knocking sensor, all of which utilize piezoelectric characteristics. The piezoelectric device 100 may include a substrate 10 and a piezoelectric material layer 20 formed on the substrate 10.

As an unlimited example, the substrate 10 may be any member that may be elastically deformed. For example, the substrate 10 may include a solid polymer, silicon, a ceramic, a metal, or a combination thereof.

According to an embodiment, a solid polymer substrate may include a polyethylene terephthalate (PET), a polyester, a polycarbonate (PC), a polyimide (PI), a polyethylene naphthalate (PEN) polyether ether ketone (PEEK), polyarylate (PAR), polycylicolefin (PCO), polynorbornene, polyethersulphone (PES), cycloolefin polymer (COP), or a combination thereof. Furthermore, the substrate 10 may be a wafer including monocrystalline silicon, polycrystalline silicon, amorphous silicon, or a combination thereof and may include a ceramic substrate, such as a quartz substrate, a pyrex substrate, a glass substrate, and a sapphire substrate. The substrate may also be a substrate including a metal, such as aluminum, iron, copper, brass, steel, magnesium, stainless steel, or an alloy thereof. According to an embodiment, the substrate 10 may constitute a portion of a surface of the piezoelectric device 100, and the substrate 10 may be an electrode. The above-stated materials regarding the substrate 10 are merely examples, and the present invention is not limited thereto.

A surface of the substrate 10 may include a 3-dimensional pattern surface layer 11. The 3-dimensional pattern surface layer 11 may be an array of pattern single structures 11P_1. The piezoelectric material layer 20 is formed on the 3-dimensional pattern surface layer 11.

According to an embodiment, the 3-dimensional pattern surface layer 11 may be a structure that is stacked independently on the substrate 10. According to an embodiment, the pattern single structure 11P_1 constituting the 3-dimensional pattern surface layer 11 may include the same material as the substrate 10. For example, the pattern single structure 11P_1 may include a solid polymer including polyethylene terephthalate (PET), a polyester, a polycarbonate (PC), a polyimide (PI), a polyethylene naphthalate (PEN) polyether ether ketone (PEEK), polyarylate (PAR), polycylicolefin (PCO), polynorbornene, polyethersulphone (PES), cycloolefin polymer (COP), or a combination thereof. Furthermore, the pattern single structure 11P_1 may include monocrystalline silicon, polycrystalline silicon, amorphous silicon, or a combination thereof and may also include a ceramic, such as quartz, pyrex, glass, and sapphire. Furthermore, the pattern single structure 11P_1 may also include a metal, such as aluminum, iron, copper, brass, steel, magnesium, and stainless steel, or an alloy thereof. According to another embodiment, the stacked 3-dimensional pattern surface layer 11 may have a composition different from that of the substrate. The composition of the pattern single structure 11P_1 is merely an example, and the present invention is not limited thereto.

The shape of the pattern single structure 11P_1 may include an embossed shape, a dome shape, a dot shape, a trench shape, a hemisphere shape, a pyramid shape, a concavo-convex shape, a zigzag shape, a wave shape, or a mixed shape thereof. These shapes are merely examples, and the present invention is not limited thereto.

According to an embodiment, a ratio of a surface area $A_{sub}$ of a virtual plane of the substrate 10 and a surface area $A_{pat\text{-}stacked}$ to a pattern surface layer of the 3-dimensional structure may satisfy $1 < A_{pat\text{-}stacked}/A_{sub} \leq 10$. The surface area $A_{sub}$ of the virtual plane of the substrate 10 is a virtual surface area under the assumption that the substrate 10 has no 3-dimensional patterned surface.

As the surface area of the piezoelectric material layer 20 constituting a 3-dimensional interface with the pattern surface layer 11 increases, the piezoelectric material layer may be displaced in various directions despite the deformation of the substrate occurring in a specific direction. Furthermore, by expanding a stress dispersion range, the piezoelectric output may be improved in a same volume as compared with a piezoelectric material layer formed on a flat substrate surface.

The piezoelectric material layer 20 may include at least one of a piezoelectric ceramic, a piezoelectric semiconductor, and a piezoelectric polymer. According to an embodiment, the piezoelectric ceramics, the piezoelectric semiconductor, or the piezoelectric polymer may be the piezoelectric material layer 20 including lead zirconate titanate (PZT, $Pb[Zr_xTi_{1-x}]O_3$, $0<x<1$), barium titanate (BTO, $BaTiO_3$), lead magnesium niobate-lead titanate (PMN-PT), lead zinc niobate-lead titanate (PZN-PT), $BaNiTiO_3$ (BNT), barium zirconate titanate-barium calcium titanate (BZT-BCT), lead magnesium niobate-lead zirconate titanate (PMN-PZT), ZnO, AlN, polyvinylidene fluoride (PVDF), polyvinylenedifluoride-tetrafluoroethylene (PVDF-TrFE), P(VDF-TrFE-CFE), P(VDF-TrFE-CTFE), electron-irradiated P(VDF-TrFE), or a mixture thereof. The above-stated materials constituting the piezoelectric material layer 20 are merely examples, and the present invention is not limited thereto.

Furthermore, the piezoelectric material layer 20 may have a thickness from about 0.1 μm to about 10 μm. When the thickness of the piezoelectric material layer 20 is less than 0.1 μm, it is difficult to obtain sufficient piezoelectric performance. When the thickness of the piezoelectric material layer 20 exceeds 10 μm, additional piezoelectric performance due to the 3-dimensional pattern surface layer 11 may not be effectively obtained. The piezoelectric material layer 20 may be appropriately adjusted in consideration of required piezoelectric output or other piezoelectric performances. Examples of the other piezoelectric performances may include intensity and sensitivity with respect to frequencies. The above-stated descriptions are merely an example, and the present invention is not limited thereto.

Referring to FIG. 1B, the piezoelectric device 200 is a piezoelectric sensor, such as a piezoelectric energy harvesting device, an acceleration sensor, an acoustic emission (AE) sensor, an impact sensor, or a knocking sensor, and is a device using piezoelectric characteristics. The piezoelectric device 200 includes the substrate 10 and the piezoelectric material layer 20 formed on the substrate 10.

A surface of the substrate 10 may include the 3-dimensional pattern surface layer 11. The 3-dimensional pattern surface layer 11 may be an array of pattern single structures 11P_2 that are integrated with the substrate 10 to constitute the 3-dimensional pattern surface layer 11. The pattern single structures 11P_2 may be formed by etching a surface of the substrate 10. The pattern single structure 11P_2 that is integrated with the substrate 10 and constitutes the 3-dimensional pattern surface layer 11 may include the same material as the substrate 10. For example, the pattern single structure 11P_2 integrated with the substrate 10 may include a solid polymer including polyethylene terephthalate (PET), a polyester, a polycarbonate (PC), a polyimide (PI), a polyethylene naphthalate (PEN) polyether ether ketone (PEEK), polyarylate (PAR), polycylicolefin (PCO), polynorbornene, polyethersulphone (PES), cycloolefin polymer (COP), or a combination thereof. Furthermore, the pattern single structure 11P_2 may include monocrystalline silicon, polycrystalline silicon, amorphous silicon, or a combination thereof and may also include a ceramic, such as quartz, pyrex, glass, and sapphire. Furthermore, the pattern single structure 11P_2 may also include a metal, such as aluminum, iron, copper, brass, steel, magnesium, and stainless steel, or an alloy thereof. The composition of the pattern single structure 11P_2 is merely an example, and the present invention is not limited thereto.

Furthermore, the shape of the pattern single structure 11P_2 integrated with the substrate 10 may include an embossed shape, a dome shape, a dot shape, a trench shape, a hemisphere shape, a pyramid shape, a concavo-convex shape, a zigzag shape, a wave shape, or a mixed shape thereof. These shapes are merely examples, and the present invention is not limited thereto.

Furthermore, according to an embodiment, a ration of a surface area $A_{sub}$ of the virtual plane of the substrate 10 to a surface area $A_{pat\text{-}integral}$ of the pattern single structure 11P_2 integrated with the substrate 10 may satisfy $1 < A_{pat\text{-}integral}/A_{sub} \leq 10$. The surface area $A_{sub}$ of the virtual plane of the substrate 10 is a virtual surface area under the assumption that the substrate 10 has no 3-dimensional patterned surface.

As the surface area of the piezoelectric material layer 20 constituting a 3-dimensional interface with respect to the pattern surface layer 11 increases, the piezoelectric material layer may be displaced in various directions despite the deformation of the substrate occurring in a specific direction. Furthermore, by expanding a stress dispersion range, the piezoelectric output may be improved in a same volume as compared with a piezoelectric material layer formed on a flat substrate surface.

Figure 2:
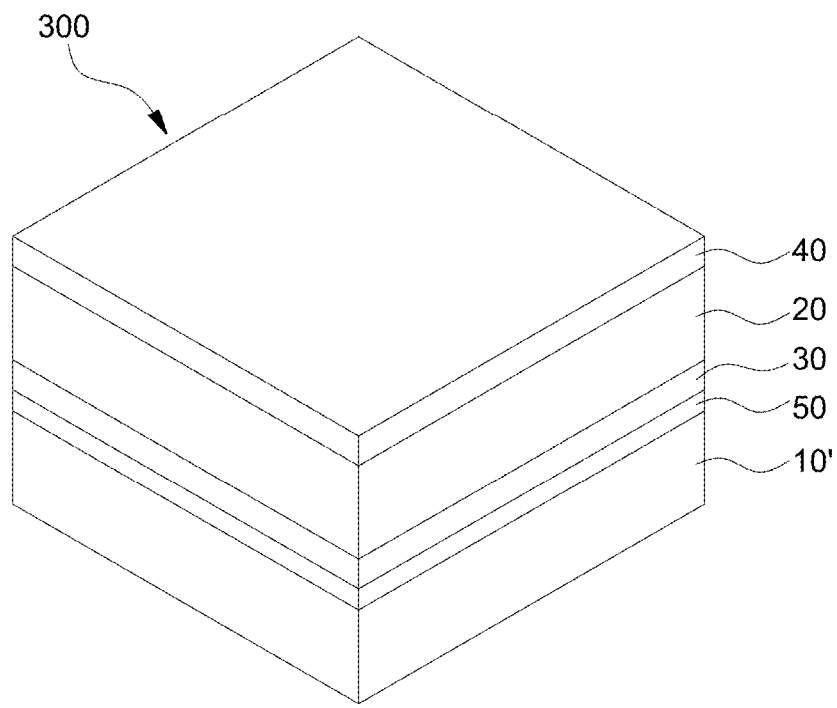
FIG. 2 is a cross-sectional view of a piezoelectric device according to an embodiment of the present invention.

FIG. 2 is a cross-sectional view of a piezoelectric device according to an embodiment of the present invention.

Referring to FIG. 2, according to an embodiment, a piezoelectric device 300 includes a substrate 10' having a 3-dimensional pattern surface layer formed on a surface thereof, the piezoelectric material layer 20, a first electrode layer 30 between the substrate 10' having formed thereon the 3-dimensional pattern surface layer and the piezoelectric material layer 20, and a second electrode layer 40 facing the first electrode layer 30.

According to an embodiment, the first electrode layer 30 and the second electrode layer 40 may include at least one of Pt, Au, Ti, Pd, Ir, Ag, Ru, Ni, STS, Al, Mo, Cr, Cu, W, ITO (Sn-doped $In_2O_3$), and FTO (F-doped $SnO_2$). Furthermore, the first electrode layer and the second electrode layer may have the same composition.

According to an embodiment, the first electrode layer and the second electrode layer may have a thin-film-like shape, a wire-like shape, or a mesh-like shape. The above-stated descriptions regarding the first and second electrode layers 30 and 40 are merely examples, and the present invention is not limited thereto.

According to another embodiment, the piezoelectric device 300 may further include a buffer layer 50 between the substrate 10' having formed thereon the 3-dimensional pattern surface layer and the first electrode layer 30. The buffer layer 50 may be attached to the substrate 10' or the first electrode layer 30 by applying an adhesive, such as Ti or Cr, in order to increase adhesion between the substrate 10' and the first electrode layer 30. The buffer layer 50 may increase the electrical coupling between the piezoelectric material layer 20 and the first electrode layer 30, and thus energy generated by the piezoelectric material layer 20 may be easily transferred to the first electrode layer 30. According to an embodiment, the buffer layer 50 including Ti, W, Pt, Au, Mo, Ni, $TiO_2$, Cr, or a mixture thereof may control a direction of crystal growth between the substrate 10' having the 3-dimensional pattern surface layer and the first electrode layer 30 and the piezoelectric material layer 20 and buffers stress or relaxes thermal expansion coefficient difference between different layers. Furthermore, the buffer layer 50 may also prevent diffusion of materials of different layers between the substrate 10' having the 3-dimensional pattern surface layer and the first electrode layer 30 and the piezoelectric material layer 20. The above-stated descriptions regarding the buffer layer 50 are merely examples, and the present invention is not limited thereto.

Figure 3:
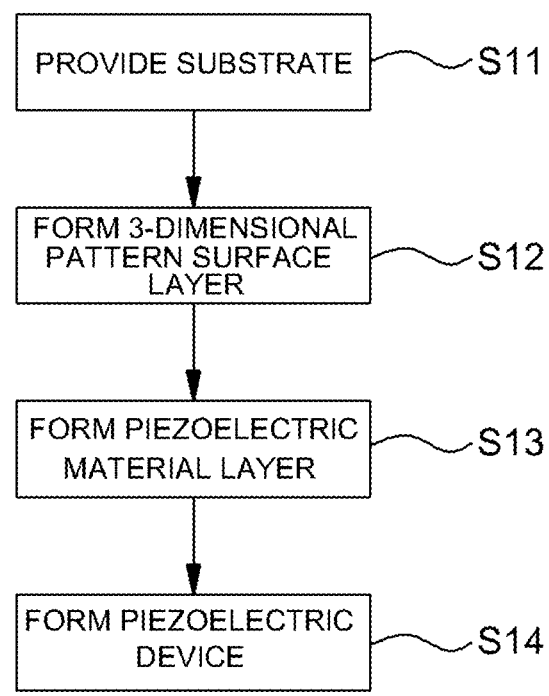
FIG. 3 is a flowchart showing a method of fabricating a piezoelectric device according to an embodiment of the present invention.

FIG. 3 is a flowchart showing a method of fabricating a piezoelectric device according to an embodiment of the present invention.

Referring to FIG. 3, a method of fabricating a piezoelectric device according to an embodiment includes an operation S11 for providing a substrate, an operation S12 for forming a 3-dimensional pattern surface layer on a surface of the substrate, and an operation S13 for forming a piezoelectric material layer on the pattern surface layer, and thus the piezoelectric device is formed (operation S14).

In detail, as an unlimited example, in operation S11, the substrate in the operation for providing the substrate may be any member that may be elastically deformed. For example, the substrate may include a solid polymer, silicon, ceramic, a metal, or a combination thereof. Furthermore, for example, the substrate may be an electrode and may be a surface of a piezoelectric energy harvesting device or a surface of a piezoelectric sensor. Furthermore, as described below, the substrate may also include a 3-dimensional pattern surface layer on the substrate. The above-stated descriptions regarding the substrate are merely examples, and the present invention is not limited thereto.

In detail, operation S12 may be performed by using a physical vapor deposition method, a chemical vapor deposition method, a chemical solution growing method, a dry etching method, a wet etching method, a powder coating method for forming a concavo-convex structure by spraying particle powders, a method of forming a pattern by using a magnetic field, or a mixed method thereof. A surface of the substrate may be etched to form a pattern structure integrated with the substrate or a mixed pattern including the stacked pattern structure and the integrated pattern structure. The compositions of the 3-dimensional pattern surface layer and the substrate and the methods of forming the same are merely examples, and the present invention is not limited thereto.

The operations for forming a 3-dimensional pattern surface layer on a surface of the substrate will be described below in detail with respect to FIGS. 4A through 4C and 7A through 7C. However, they are merely examples, and the present invention is not limited thereto. Furthermore, the 3-dimensional pattern surface layer 11 formed in operation S12 exhibits the characteristics of the above-stated pattern structure layer.

In operation S13, the piezoelectric material layer is formed, and the piezoelectric material layer according to an embodiment exhibits the characteristics of the above-stated piezoelectric material layer.

In operation S14, the piezoelectric device may be formed through operations S11, S12, and S13 described above. According to an embodiment, the method may also include an operation for forming a first electrode layer between operations S12 and S13 described above. Furthermore, the method may include forming an adhesive layer between the first electrode layer and a surface of the substrate in order to increase adhesion between the first electrode layer and the substrate having the 3-dimensional pattern surface layer.

According to another embodiment, the method may further include forming a second electrode layer on the piezoelectric material layer. The first electrode layer, the second electrode layer, and the adhesive layer described above with respect to operation S14 exhibit characteristics of the first electrode layer, the second electrode layer, and the adhesive layer described above.

Figure 4A:
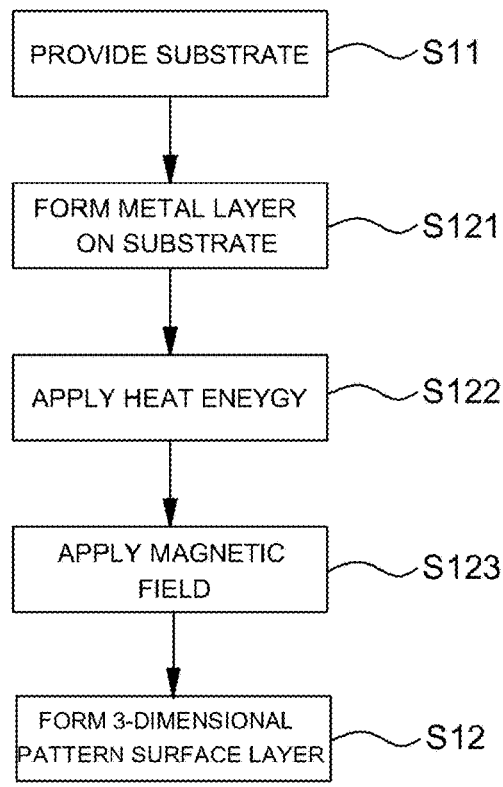
FIG. 4A is a flowchart showing a process for forming 3-dimensional pattern according to another embodiment of the present invention.
Figure 4B:
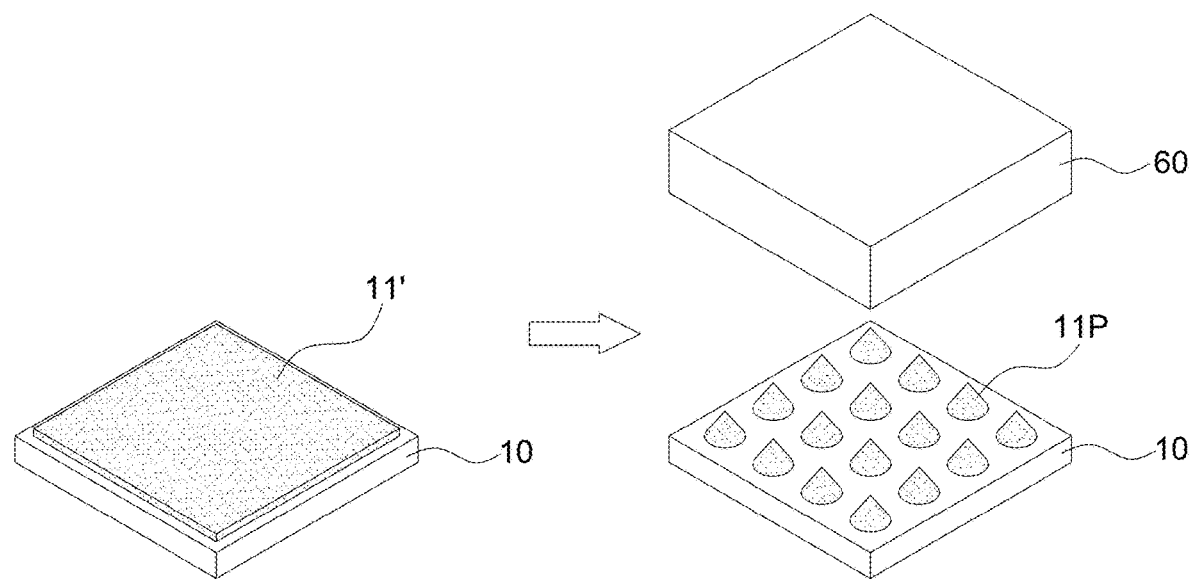
FIGS. 4B through 4C are schematic diagrams showing a process for forming a 3-dimensional pattern according to another embodiment of the present invention.
Figure 4C:
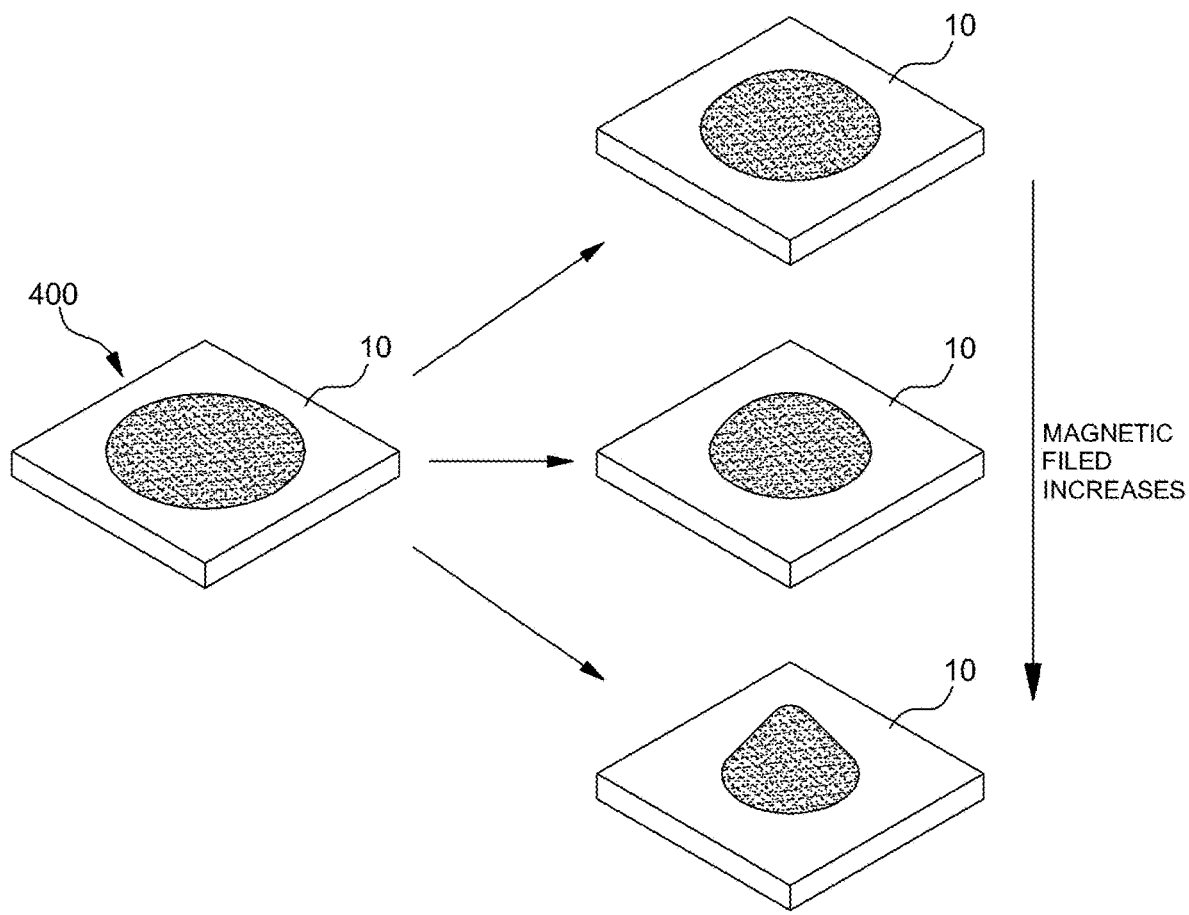

FIG. 4A is a flowchart showing a process for forming 3-dimensional pattern according to another embodiment of the present invention, and FIGS. 4B through 4C are schematic diagrams showing a process for forming a 3-dimensional pattern according to another embodiment of the present invention.

Referring to FIG. 4A, according to an embodiment, a substrate having formed thereon the 3-dimensional structure is fabricated through an operation S11 for providing a substrate; an operation S122 for forming a metal layer on the substrate; an operation S122 for applying heat energy to the metal layer; and an operation S123 for applying a magnetic field to the metal layer to which the heat energy is applied.

In operation S11, as an unlimited example, the substrate may be any member that may be elastically deformed. For example, the substrate may include a solid polymer, silicon, ceramic, a metal, or a combination thereof.

In operation S121, according to an embodiment, the metal layer may include a layer including Fe, Ni and Co, or a mixture thereof. However, it is an unlimited example, and the metal layer may include a ferromagnetic material layer, a paramagnetic material layer, or a semi-magnetic material layer. The above-stated materials are merely examples, and the present invention is not limited thereto.

In operation S122, heat energy may be applied to the substrate on which the metal layer is formed. According to an embodiment, the heat energy is an energy source that allows the metal layer to have a fluidity and, as an unlimited example, the energy source may include plasma energy, microwave energy, and high frequency energy to allow the metal layer to have fluidity. The above-stated descriptions of the energy source are merely examples, and the present invention is not limited thereto. The energy source may vary according to the layer formed in operation S121.

In operation S123, according to an embodiment, a magnetic field may be applied to the metal layer that obtained the fluidity in operation S122, thereby forming a 3-dimensional structure. The magnetic field may include a magnetic field by a permanent magnet, a magnetic field by a magnetic derivative, and a magnetic field of an electromagnet based on electricity. Furthermore, the magnetic field may be appropriately adjusted in consideration of the shape of the 3-dimensional structure. According to an embodiment, the shape of the 3-dimensional structure may include a height, a size, and a shape of a single structure from among the 3-dimensional structures. Furthermore, the 3-dimensional pattern layer formed in operation S123 exhibits the characteristics of the pattern structure layer described above.

Referring to FIG. 4B, a process for forming a nano dot pattern by applying a magnetic field according to an embodiment is shown. In FIG. 4B, according to an embodiment, a flat silicon substrate is provided as the substrate 10 and a metal layer 11' including Ni is formed through a sputtering process. In subsequent processes, a random dot-type Ni fluid is formed by providing a fluidity to the metal layer through a process for applying heat energy in a thermal CVD apparatus, and then pattern single structures 11P and an array of the pattern single structures 11P are formed on a surface of the substrate through a process using a permanent magnet as a magnetic field source 60.

A piezoelectric device may be fabricated by directly applying the substrate including the 3-dimensional pattern surface layer fabricated through the above-stated processes to the piezoelectric device. As a result, an additional operation for removing the 3-dimensional pattern surface layer from the substrate may be omitted, and thus an economical method of fabricating a piezoelectric device may be provided.

Referring to FIG. 4C, according to an embodiment, a random dot 400 is formed by providing fluidity to a metal layer on the substrate 10, and formation of the random dot 400 is controlled by using the magnetic field source. According to an embodiment, the shape of the nano dot may vary according to the intensity of a magnetic field and a time period for applying the same. For example, when the magnetic field is weak, the nano dot may have a round and flat shape exhibiting a large contact area with the substrate. On the contrary, when the magnetic field is strong, the nano dot may have a sharp shape exhibiting a small contact area with the substrate. The above-stated descriptions regarding a nano dot pattern based on application of a magnetic field are merely examples, and the present invention is not limited thereto.

FIGS. 5A through 5F are images of 3-dimensional patterns according to other embodiments of the present invention. In particular, FIGS. 5A through 5F are images of a 3-dimensional pattern of a piezoelectric device that has undergone the operation shown in FIGS. 4A through 4C.

Figure 5A:
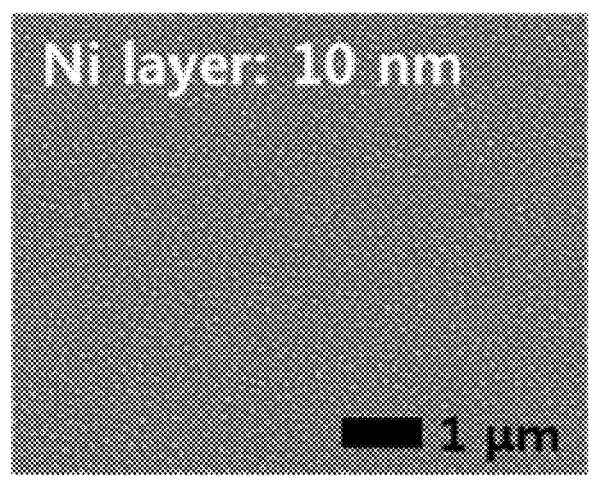
FIGS. 5A through 5F are images of 3-dimensional patterns according to other embodiments of the present invention.
Figure 5B:
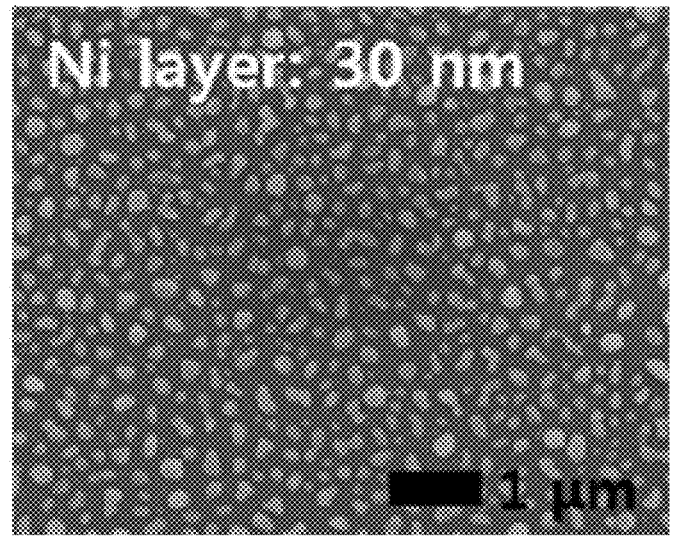
Figure 5C:
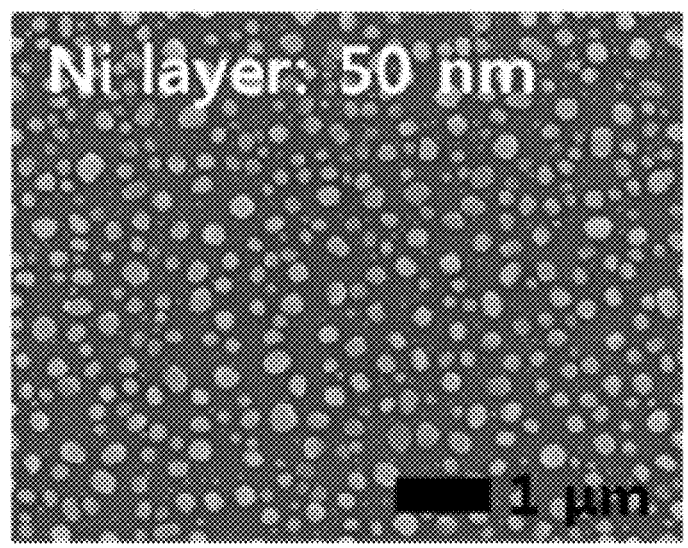

Referring to FIG. 5A, a Ni layer was formed on a silicon substrate through a 10 nm sputtering process, and a magnetic field was applied by using a permanent magnet to form nano dots having an average diameter from 10 nm to 30 nm. Referring to FIG. 5B, a Ni layer was formed on a silicon substrate through a 30 nm sputtering process, and a magnetic field was applied by using a permanent magnet to form nano dots having an average diameter from 40 nm to 65 nm. Referring to FIG. 5C, a Ni layer was formed on a silicon substrate through a 50 nm sputtering process, and a magnetic field was applied by using a permanent magnet to form nano dots having an average diameter from 70 nm to 100 nm. Referring to FIGS. 5A through 5C, it may be seen that pattern surface layers having different 3-dimensional structures were fabricated by changing process conditions. The above-stated Ni formation thicknesses and nano dot sizes are merely examples, and the present invention is not limited thereto.

Figure 5D:
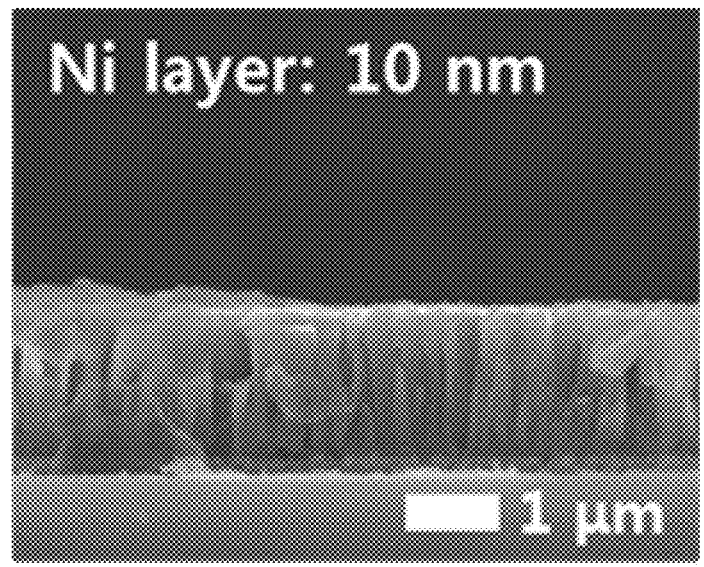
Figure 5E:
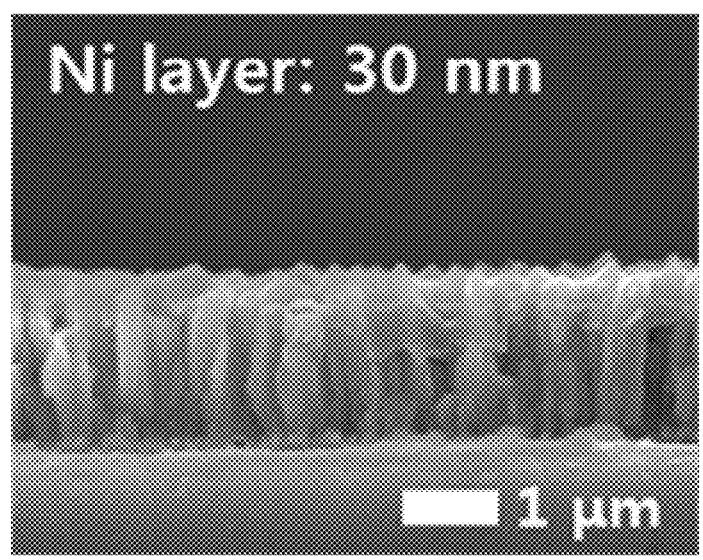
Figure 5F:
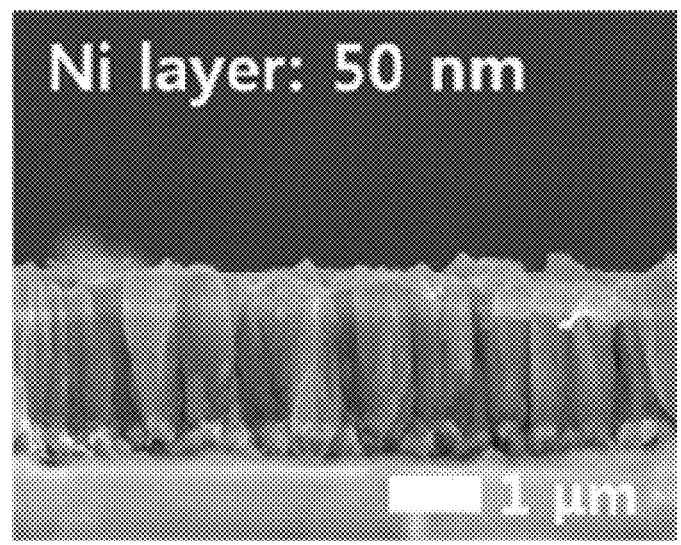

FIG. 5D is a cross-sectional view of a piezoelectric device in which a piezoelectric material layer is formed on a substrate having formed thereon the nano dots shown in FIG. 5A. FIG. 5E is a cross-sectional view of a piezoelectric device in which a piezoelectric material layer is formed on a substrate having formed thereon the nano dots shown in FIG. 5B. FIG. 5F is a cross-sectional view of a piezoelectric device in which a piezoelectric material layer is formed on a substrate having formed thereon the nano dots shown in FIG. 5C. The substrates, the nano dots, and the piezoelectric material layers shown in the cross-sections of the piezoelectric devices of FIGS. 5D through 5F are merely examples, and the present invention is not limited thereto.

Figure 6:
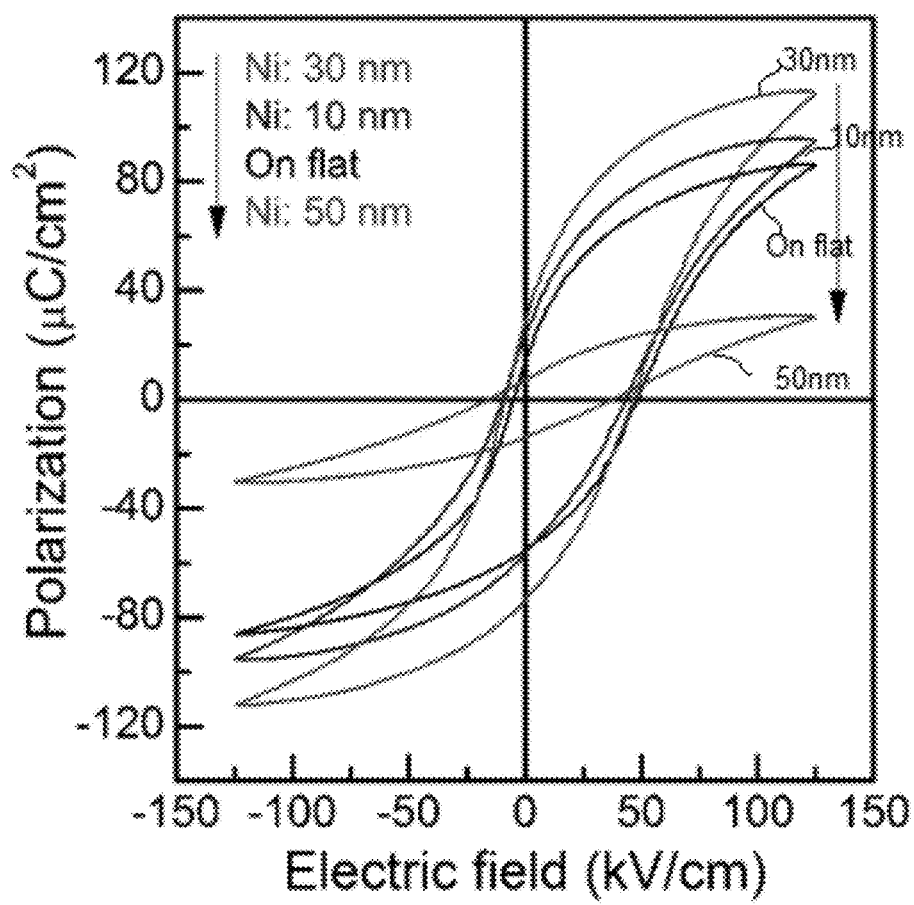
FIG. 6 is a characteristic change graph regarding piezoelectric devices according to other embodiments of the present invention.

FIG. 6 is a characteristic change graph regarding piezoelectric devices according to other embodiments of the present invention.

In detail, the characteristic change graph of the piezoelectric device of FIG. 6 is a result of measuring piezoelectric characteristics of the piezoelectric devices of FIGS. 5D through 5F.

Referring to FIG. 6, it may be seen that, as compared to a case where a piezoelectric material layer is formed on a flat silicon surface as described below, the piezoelectric device of FIG. 5D having the Ni layer of about 10 nm exhibits superior performance and the piezoelectric device of FIG. 5E having the Ni layer with a thickness of about 30 nm exhibits more superior performance. As the thickness of a Ni layer increases from about 10 nm to about 30 nm, the surface area of the interface between a substrate having formed thereon nano dots and a piezoelectric material layer increases. As a result, the piezoelectric effect in the piezoelectric material layer increases, and thus piezoelectric output is improved.

Specifically, when energy is applied from the outside, the piezoelectric material layer may generate a displacement uniformly in various directions according to a force applied to the piezoelectric material layer. Furthermore, by expanding a stress dispersion range, the piezoelectric output may be improved in a same volume as compared with a piezoelectric material layer formed on a flat substrate surface. However, in the case of the device of FIG. 5F in which the Ni layer is formed to have a thickness of about 50 nm, the Ni layer with relatively poor conductivity is excessively formed, and thus the output of the device is relatively decreased as compared to those of the devices in which the Ni layer are respectively formed to have thicknesses of about 10 nm and about 30 nm. However, the above-stated numerical ranges are merely examples, and the present invention is not limited thereto. For example, in a trench structure, the piezoelectric output may be improved even in a shape of several micro-units by changing the shape of a 3-dimensional structure.

Figure 7A:
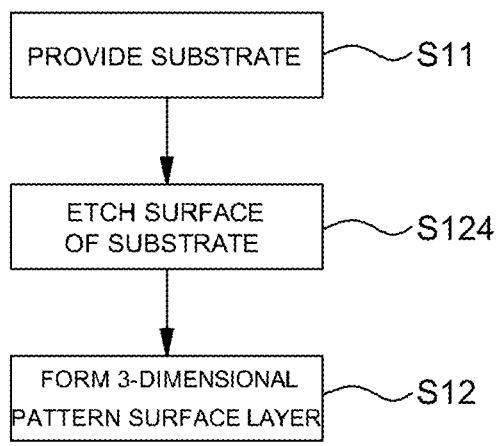
FIG. 7A is a flowchart showing formation of a 3-dimensional pattern according to another embodiment of the present invention.
Figure 7B:
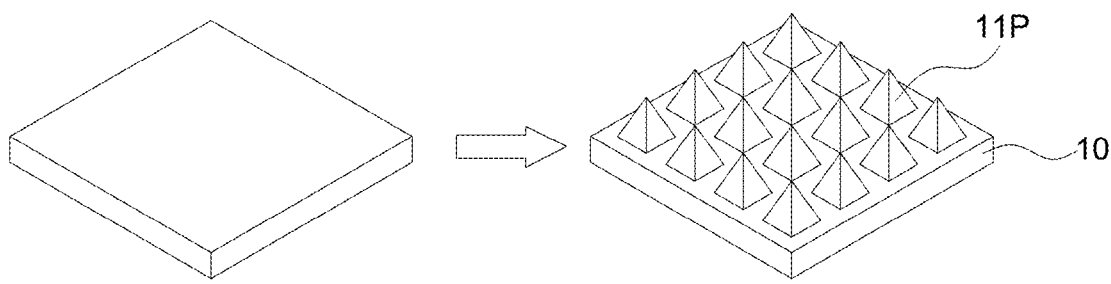
FIGS. 7B and 7C are schematic diagrams showing a process for forming a 3-dimensional pattern according to other embodiments of the present invention.
Figure 7C:
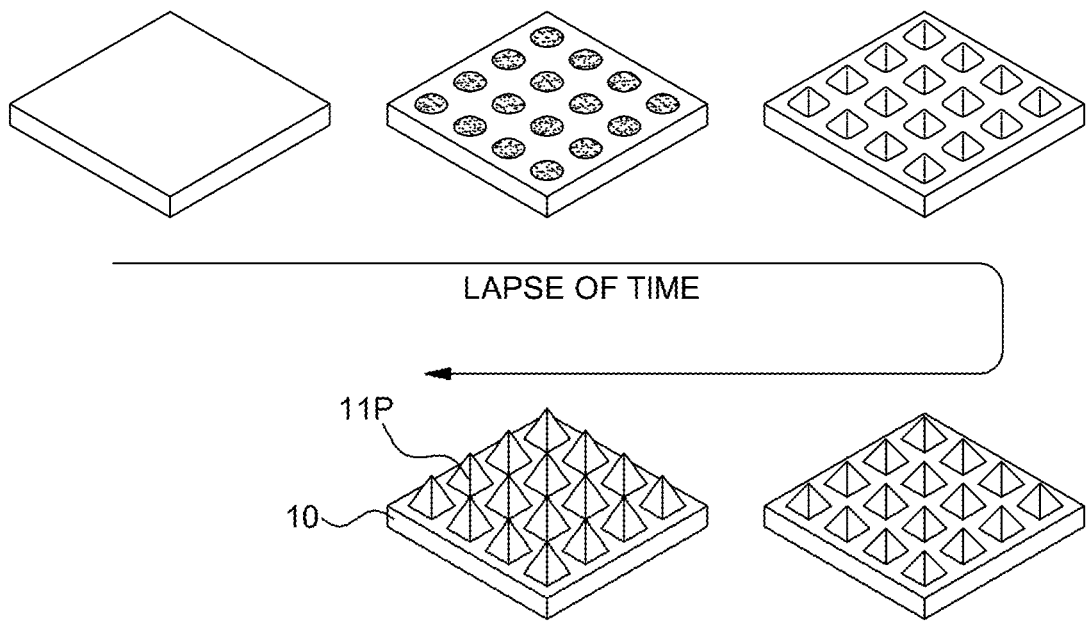

FIG. 7A is a flowchart showing formation of a 3-dimensional pattern according to another embodiment of the present invention, and FIGS. 7B and 7C are schematic diagrams showing a process for forming a 3-dimensional pattern according to other embodiments of the present invention.

Referring to FIG. 7A, according to an embodiment, a substrate on which the 3-dimensional structure is formed is fabricated through an operation S11 for providing a substrate and an operation S124 for etching a surface of the substrate.

In operation S11, the substrate may be any member that may be elastically deformed, as an unlimited example. For example, the substrate may include a solid polymer, silicon, ceramic, a metal, or a combination thereof.

In operation S124, the 3-dimensional pattern surface layer is fabricated through an operation for forming a pattern structure integrated with the substrate by etching the surface of the substrate, wherein the etching may include an etching using physical impact, a dry etching using plasma, or a wet etching using a chemical substance.

According to an embodiment, the shape of the 3-dimensional structure may include a height, a size, and a shape of a single structure from among the 3-dimensional structures. Furthermore, the 3-dimensional pattern layer formed in operation S124 exhibits the characteristics of the pattern structure layer described above.

FIG. 7B is a schematic diagram showing a process for forming a pyramid-like pattern and a trench-like pattern through etching of a substrate according to an embodiment. According to the embodiment shown in FIG. 7B, a flat silicon substrate is provided as the substrate 10, and the patterned single structure 11P, e.g., a pyramid-like pattern and a trench-like pattern, is fabricated on a surface of the substrate 10 by using a KOH solution, which is an etching solution and may be used for chemically etching silicon.

A piezoelectric device may be fabricated by directly applying a substrate including a 3-dimensional pattern surface layer fabricated through the above-stated processes to the piezoelectric device. As a result, an additional operation for removing the 3-dimensional pattern surface layer may be omitted from the substrate, and thus an economical method of fabricating a piezoelectric device may be provided.

Referring to FIG. 7C, according to an embodiment, a silicon substrate having a flat surface is etched by using a KOH solution as an etching solution. The shape of the silicon substrate may vary depending on a time of exposure of the substrate to the etching solution, a concentration of the etching solution, and a temperature of the etching solution during the etching operation. For example, when etching is performed by using an etching solution for a short period of time, a uniform trench-like structure is formed. As time passes, irregular shapes are formed. When even more time passes, a gently smooth shape may be formed. Furthermore, according to an embodiment, a larger single structure may be formed as the time of exposure to the etching solution increases. The above-stated description regarding the silicon substrate having a flat surface that obtains a 3-dimensional pattern surface layer due to the etching solution is merely an example, and the present invention is not limited thereto.

FIGS. 8A through 8H are images of 3-dimensional patterns according to other embodiments of the present invention. Specifically, FIGS. 8A through 8H are images of 3-dimensional patterns of a piezoelectric device that have undergone the operations of FIGS. 7A through 7C according to an embodiment.

Figure 8A:
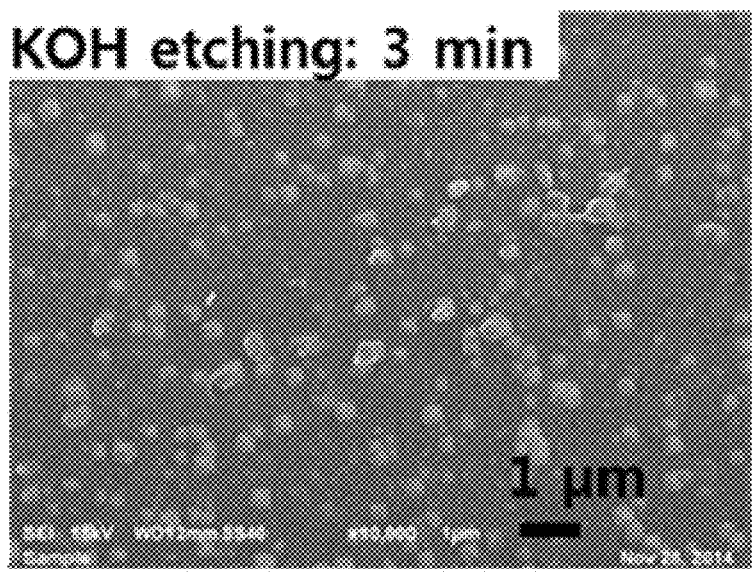
FIGS. 8A through 8H are images of 3-dimensional patterns according to other embodiments of the present invention.
Figure 8B:
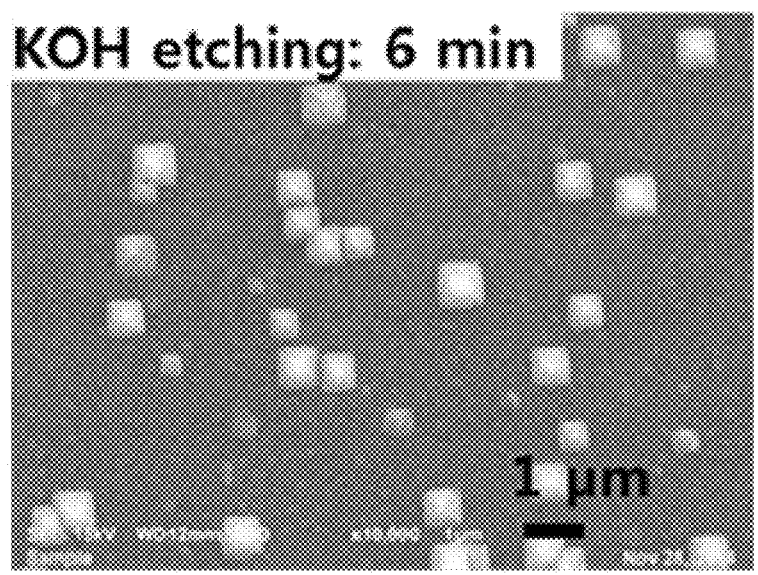
Figure 8C:
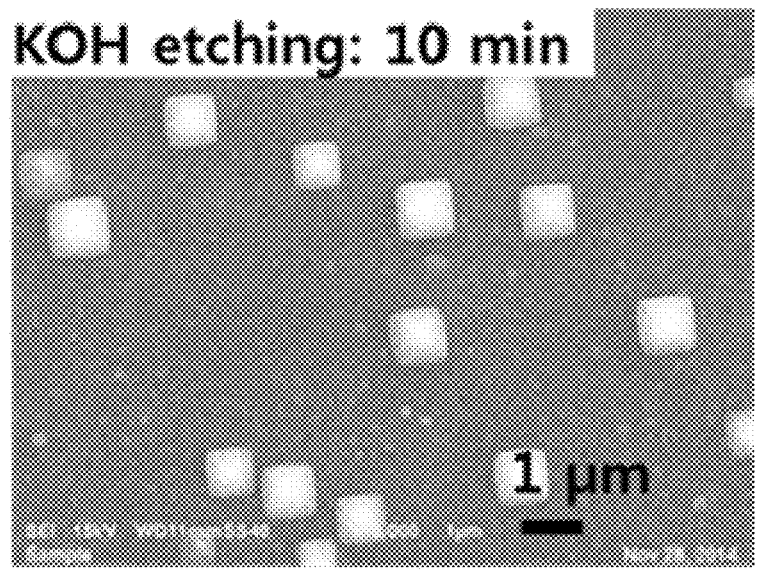
Figure 8D:
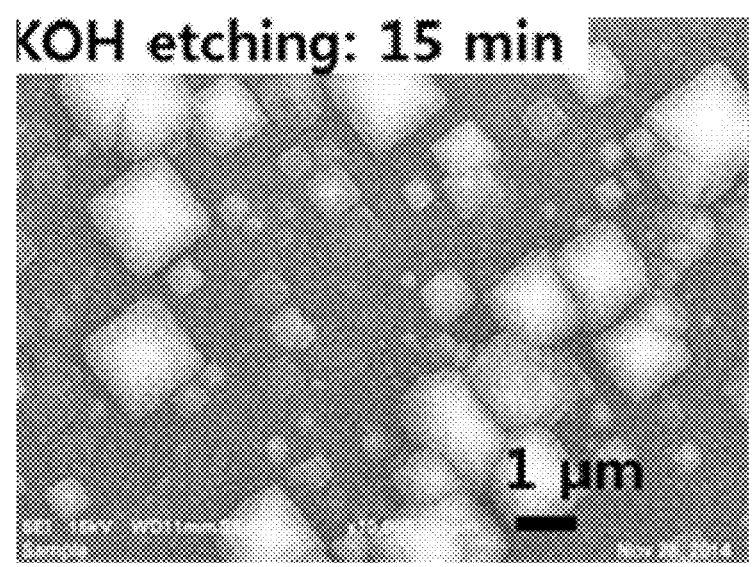

Referring to FIG. 8A, a chemical wet etching for exposing a flat silicon substrate to a KOH solution for 3 minutes was performed to form a pattern structure integrated with the silicon substrate. Referring to FIG. 8B, a chemical wet etching for exposing a flat silicon substrate to a KOH solution for 6 minutes was performed to form a pattern structure integrated with the silicon substrate. Referring to FIG. 8C, a chemical wet etching for exposing a flat silicon substrate to a KOH solution for 10 minutes was performed to form a pattern structure integrated with the silicon substrate. Referring to FIG. 8D, a chemical wet etching for exposing a flat silicon substrate to KOH solution for 15 minutes was performed to form a pattern structure integrated with the silicon substrate. The above-stated chemical wet etching operations using the KOH solution are merely examples, and the present invention is not limited thereto.

Figure 8E:
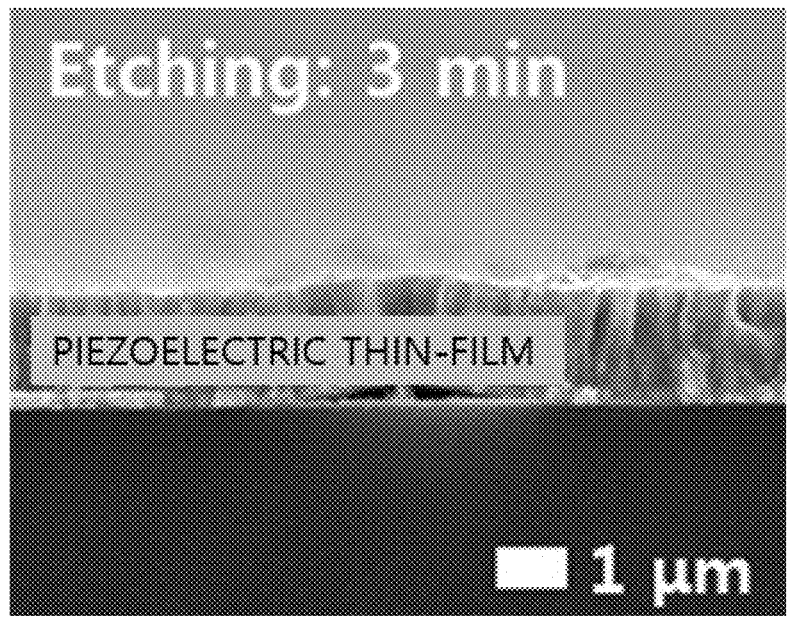
Figure 8F:
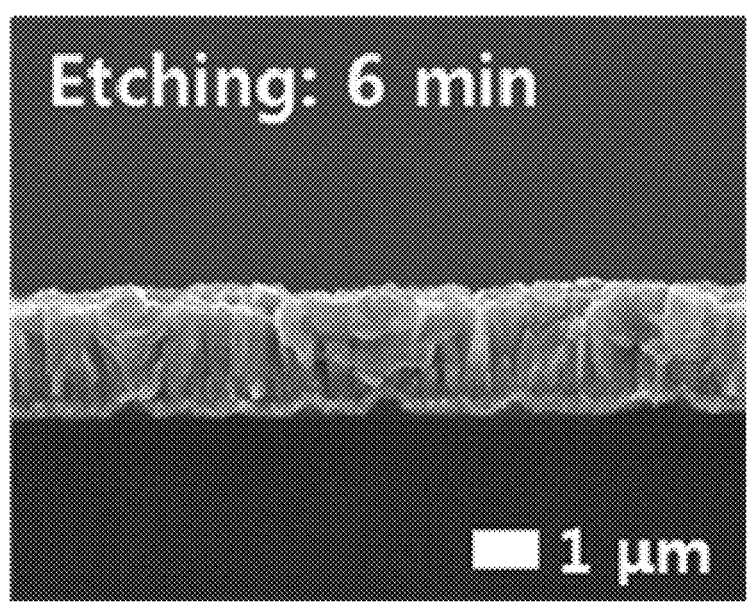
Figure 8G:
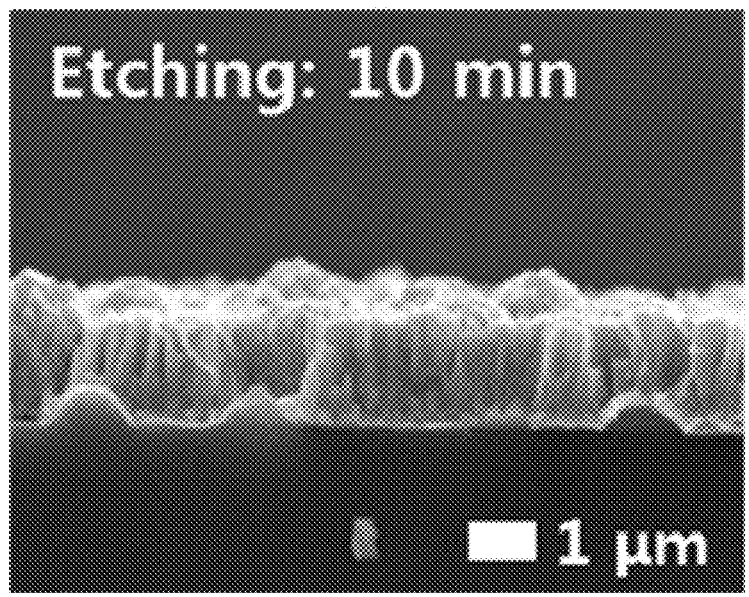
Figure 8H:
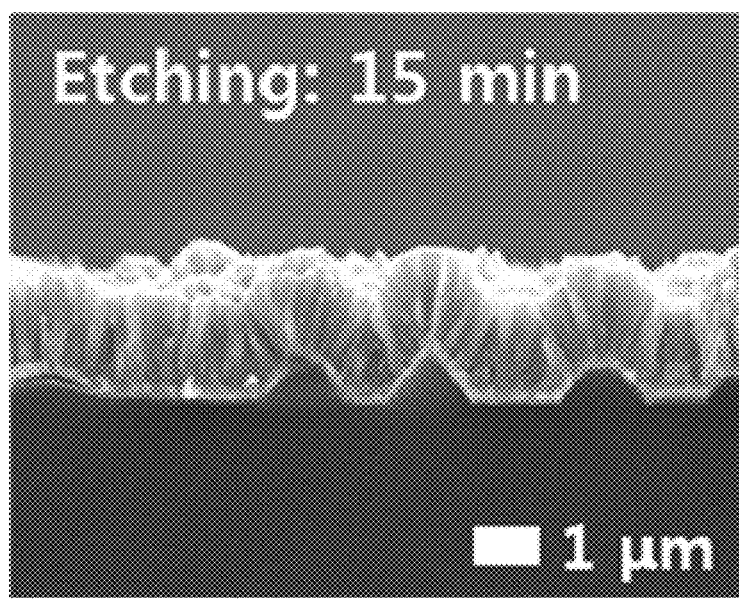

FIG. 8E is a cross-sectional view of a piezoelectric device in which a piezoelectric material layer is formed on the pattern structure integrated with the silicon substrate of FIG. 8A. FIG. 8F is a cross-sectional view of a piezoelectric device in which a piezoelectric material layer is formed on the patterned structure integrated with the silicon substrate of FIG. 8B. FIG. 8G. is a cross-sectional view of a piezoelectric device in which a piezoelectric material layer is formed on the patterned structure integrated with the silicon substrate of FIG. 8C. FIG. 8H is a cross-sectional view of a piezoelectric device in which a piezoelectric material layer is formed on the patterned structure integrated with the silicon substrate of FIG. 8D. The patterned structure integrated with the silicon substrate and the piezoelectric material layer shown in the cross-sections of the piezoelectric devices of FIGS. 8E through 8H are merely examples, and the present invention is not limited thereto.

Figure 9:
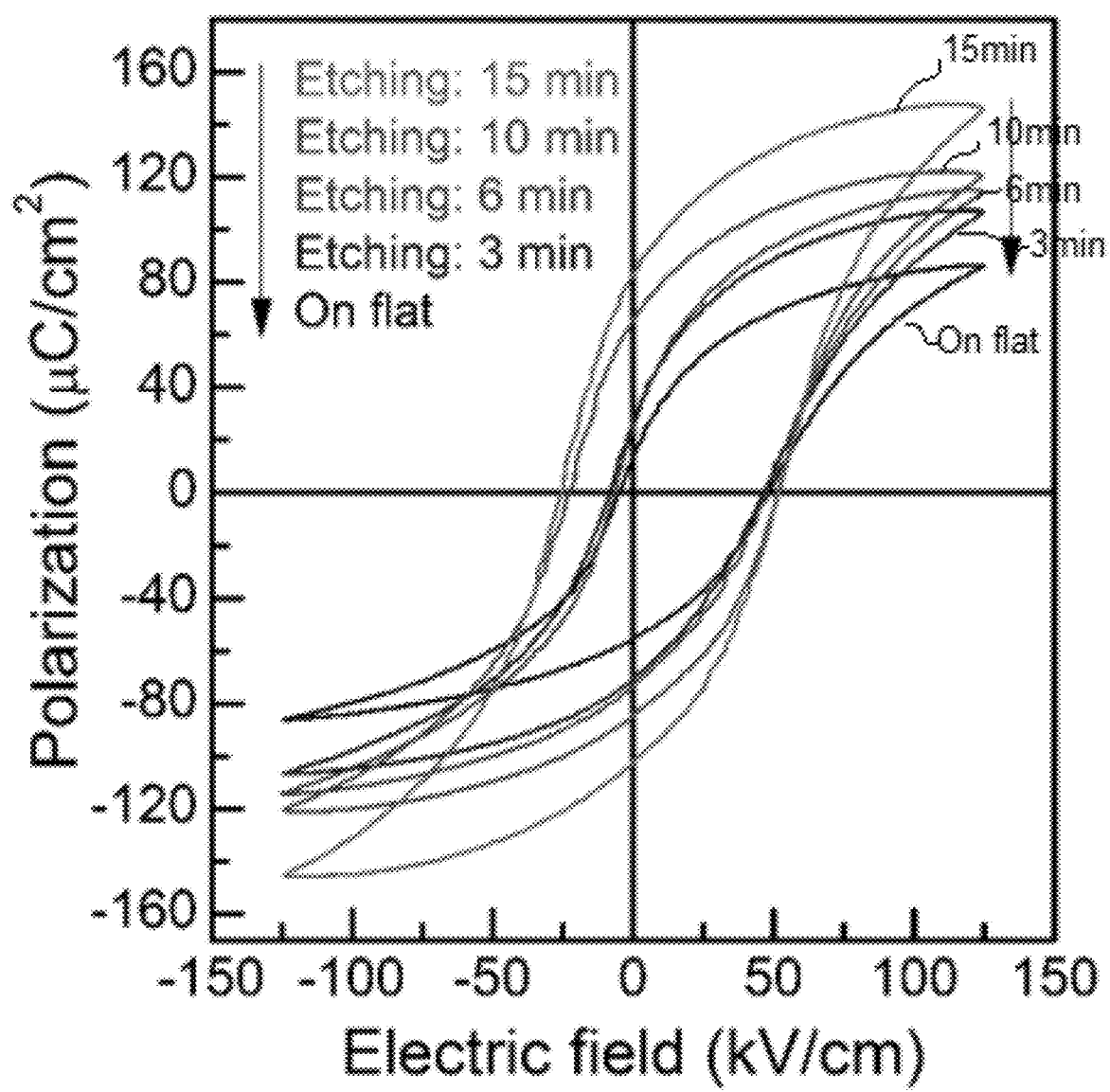
FIG. 9 is a characteristic change graph of piezoelectric devices according to other embodiments of the present invention.

FIG. 9 is a characteristic change graph of piezoelectric devices according to other embodiments of the present invention. In detail, the characteristic change graph of the piezoelectric devices of FIG. 9 is a result of measuring piezoelectric characteristics of the piezoelectric devices of FIGS. 8E through 8H.

Referring to FIG. 9, it may be seen that, as the chemical wet etching time for exposing a piezoelectric device to a KOH solution increases, the piezoelectric device exhibits better performance than a piezoelectric device formed on a flat silicon substrate. In other words, as the etching time increases, the irregularity of a trench-like shape or a pyramid-like shape on a flat silicon substrate and size of a single shape increase, and thus the piezoelectric effect increases in a piezoelectric material layer. In other words, as the surface area of the interface between the substrate and the piezoelectric material layer is increased, the piezoelectric effect is increased in the piezoelectric material layer, and thus the piezoelectric output is improved.

Specifically, when energy is applied from the outside, the piezoelectric material layer may generate uniformly displacements in various directions according to a force applied to the piezoelectric material layer. Furthermore, by expanding a stress dispersion range, the piezoelectric output may be improved in a same volume as compared with a piezoelectric material layer formed on a flat substrate surface.

Figure 10:
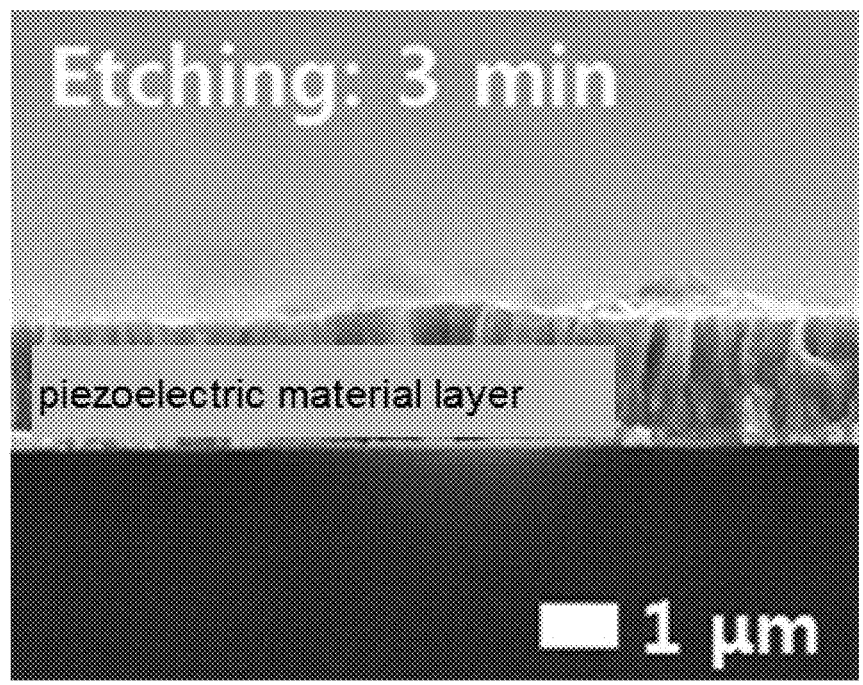
FIG. 10 is an image of a piezoelectric device according to a comparative example.

FIG. 10 is an image of a piezoelectric device according to a comparative example.

Specifically, a piezoelectric material layer is formed on a flat silicon surface, and thus the piezoelectric material layer has a two-dimensional flat interface with the substrate, unlike the embodiments of the present invention.

Figure 11A:
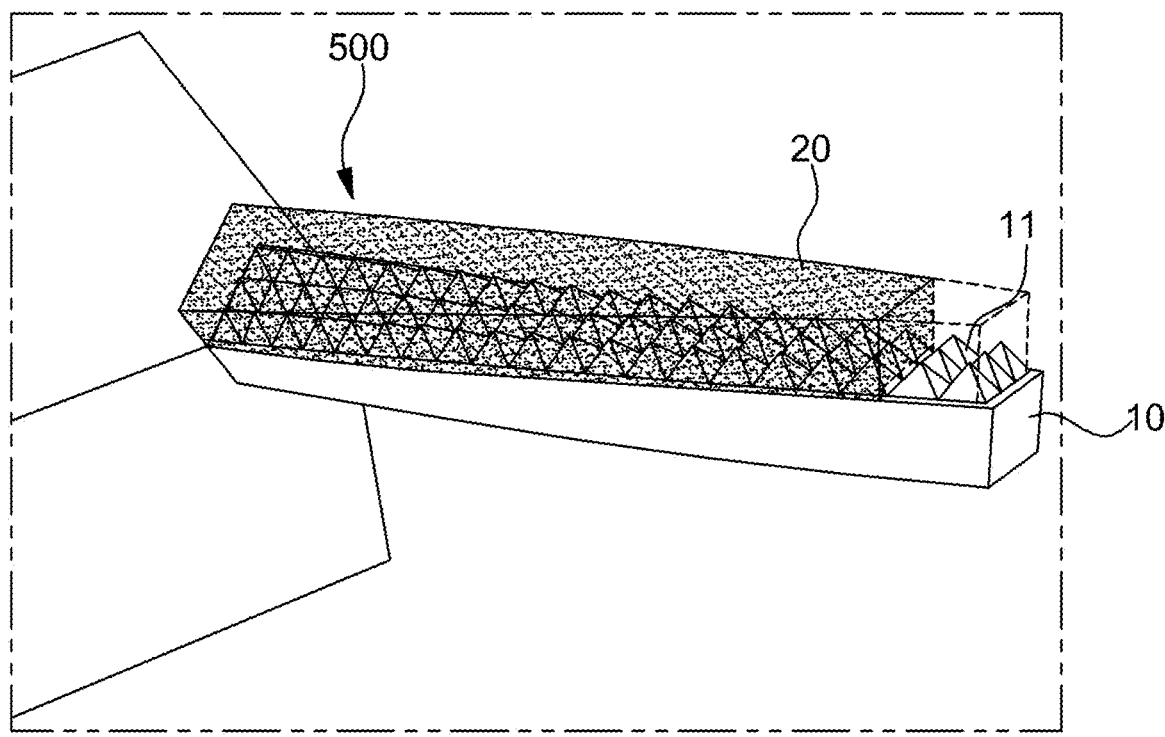
FIG. 11A is a structural view of a piezoelectric device according to another embodiment of the present invention.
Figure 11B:
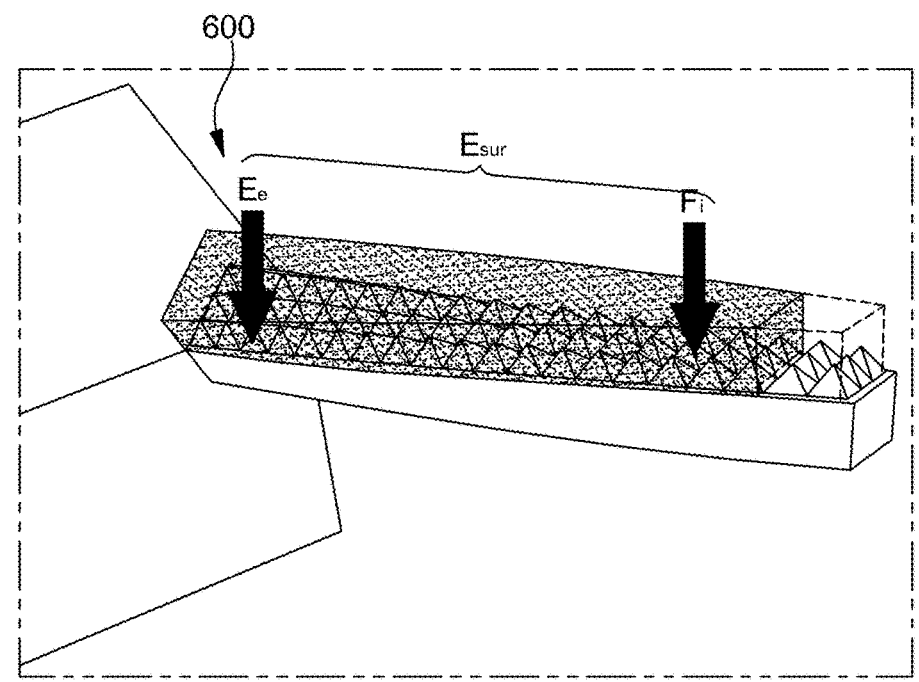
FIG. 11B is an operation concept diagram of a piezoelectric device according to another embodiment of the present invention.
Figure 11B:
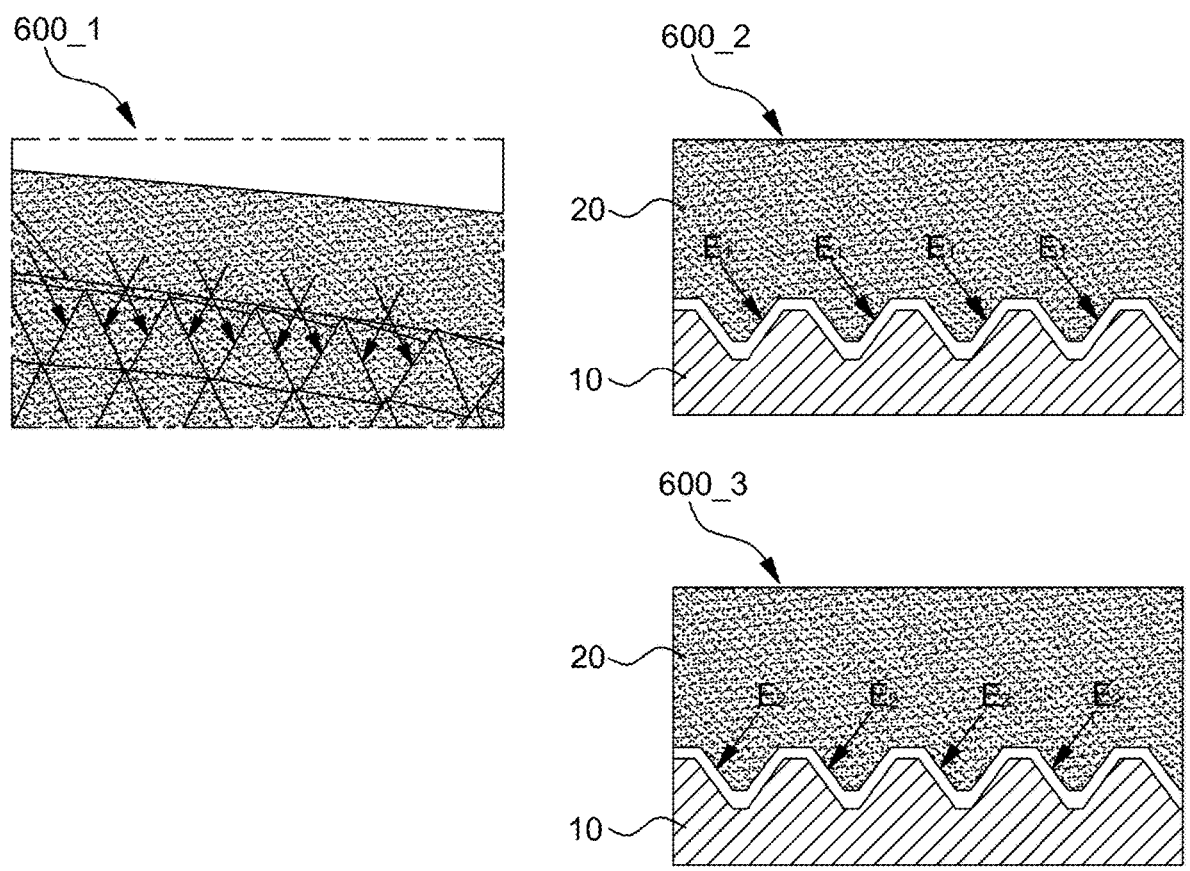
Figure 11C:
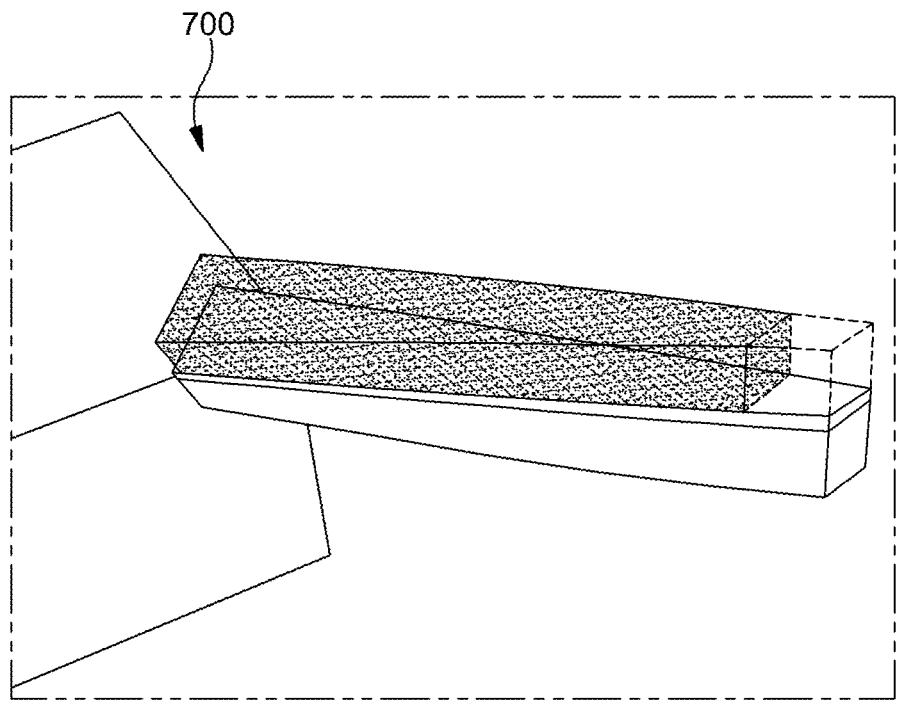
FIG. 11C is a structural view of a piezoelectric device according to a comparative example.
Figure 11D:
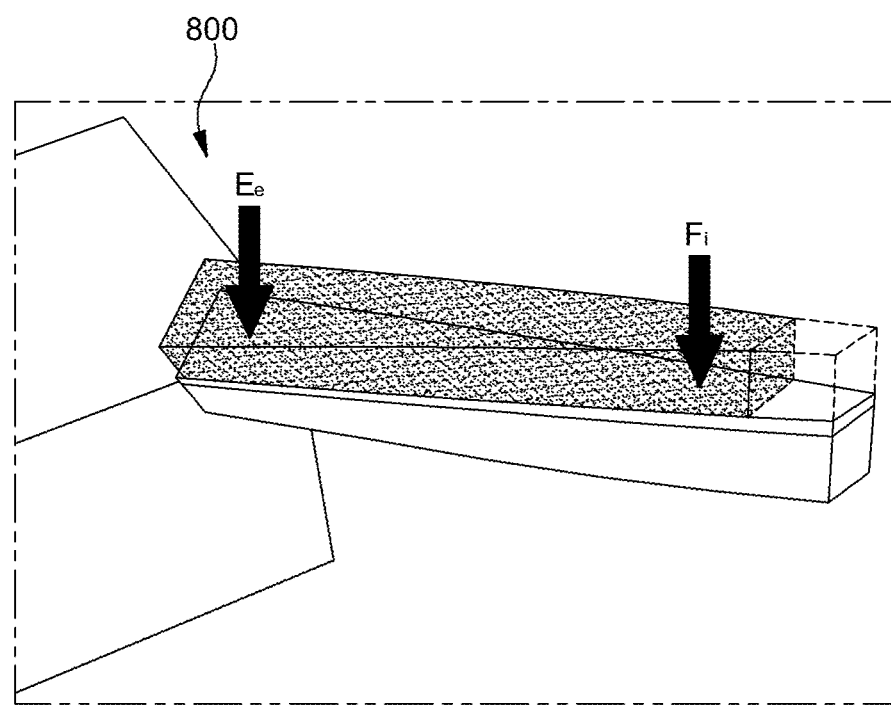
FIG. 11D is an operation concept diagram of a piezoelectric device according to a comparative example.

FIGS. 11A and 11B are a structural view of a piezoelectric device 500 according to another embodiment of the present invention and operation concept diagrams 600_1, 600_2 and 600_3 of a piezoelectric device 600, and FIGS. 11C and 11D are a structural diagram of a piezoelectric device 700 according to a comparative example and an operation concept diagram 800 of a piezoelectric device.

Referring to FIG. 11A, the piezoelectric device 500 according to another embodiment of the present invention is a cantilever-type piezoelectric device and includes the 3-dimensional pattern surface layer 11 and the piezoelectric material layer 20 on the substrate 10. According to an embodiment, the piezoelectric device 500 may have one of various structures, such as a cantilever-type structure, a membrane-type structure, and a wire-type structure, and may act on a moving joint or clothing. The above descriptions of the piezoelectric device are merely examples, and the present invention is not limited thereto.

FIG. 11B is a conceptual diagram showing the operation concept of the piezoelectric device 500 due to a twisting force when the piezoelectric device 500 of FIG. 11A is subjected to the twisting force.

Referring to FIG. 11B, the piezoelectric device 600 that received a twisting force outputs an energy $E_{sur}$ due to an energy $E_e$, which is limitedly output from a fixed end or a free end based on a twisting force $F_i$ applied from the outside, and a 3-dimensional pattern surface layer of the piezoelectric device.

In other words, since the energy $E_{sur}$, which is the energy output due to the influence of the surface layer, is generated in addition to the energy $E_e$, which is the output energy due to the macroscopic structure including the length, the shape, and the thickness of the piezoelectric device, the piezoelectric device may exhibit increased output as compared to that of a piezoelectric device without a 3-dimensional pattern surface layer.

Surface-based output energies 600_1, 600_2, and 600_3 according to the shape of the surface may be indicated by output energies $E_1$ and $E_2$ due to the interface between the 3-dimensional pattern surface layer 11 and the piezoelectric material layer 20.

Referring to FIG. 11C, the piezoelectric device 700 according to the comparative example is a cantilever-type piezoelectric device and includes the piezoelectric material layer 20 formed on the substrate 10 without a 3-dimensional pattern surface layer. The piezoelectric device 500 may have one of various structures, such as a cantilever-type structure, a membrane-type structure, and a wire-type structure, and may act on a moving joint or clothing. The above descriptions of the piezoelectric device are merely examples, and the present invention is not limited thereto.

FIG. 11D is a conceptual diagram showing the operation concept of the piezoelectric device 700 due to a twisting force when the piezoelectric device 700 of FIG. 11C is subjected to the twisting force.

Referring to FIG. 11D, the piezoelectric device 700, 800 that received a twisting force only generates an energy $E_e$, which is limitedly output from a fixed end or a free end based on a twisting force $F_i$ applied from the outside and is due to the macroscopic structure including the length, the shape, and the thickness of the piezoelectric device. In this case, the energy $E_{sur}$ that is output due to the influence of a 3-dimensional pattern surface layer of a piezoelectric device according to an embodiment of the present invention is not generated in the comparative example, and thus the output performance of the piezoelectric device according to the comparative example is inferior than that of the piezoelectric device according to an embodiment of the present invention.

The piezoelectric device according to the embodiment of the present invention includes a pattern surface layer having a 3-dimensional structure on a substrate, thereby allowing the piezoelectric device to have an effect such as twisted force applied to the piezoelectric device, thereby providing improved piezoelectric performance.

According to an embodiment of the present invention, a piezoelectric material layer is formed on a substrate including a 3-dimensional pattern surface layer, such that the piezoelectric material layer has a 3-dimensional interface with the substrate. Therefore, despite of increase of the surface area of the interface between the piezoelectric material layer and the substrate and deformation of the substrate occurring in a particular direction, the piezoelectric material layer is displaced in various directions to expand stress dispersion range, and thus there may be provided a piezoelectric device with improved energy conversion efficiency for the overall volume as compared to a piezoelectric material layer formed on a flat substrate surface.

According to another embodiment of the present invention, since a piezoelectric device is formed by directly using a substrate including a 3-dimensional pattern surface layer, an additional process for removing the 3-dimensional pattern surface layer may be omitted, and thus an economical method of fabricating a piezoelectric device may be provided.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A piezoelectric energy harvesting device comprising:
  a substrate including a 3-dimensional pattern surface layer; and
  a piezoelectric material layer, which is formed on the 3-dimensional pattern surface layer and forms a 3-dimensional interface with the 3-dimensional pattern surface layer, the 3-dimensional interface being formed in a surface of the piezoelectric material layer facing to the substrate due to the 3-dimensional pattern surface layer.

2. The piezoelectric energy harvesting device of claim 1, wherein the piezoelectric device has a cantilever-type structure.

3. The piezoelectric energy harvesting device of claim 1, wherein the substrate comprises a solid polymer, silicon, ceramic, a metal, or a combination thereof.

4. The piezoelectric energy harvesting device of claim 1, wherein the 3-dimensional pattern surface layer comprises an array of embossed shapes, dome shapes, dot shapes, trench shapes, hemisphere shapes, pyramid shapes, concavo-convex shapes, zigzag shapes, wave shapes, or mixed shapes thereof.

5. The piezoelectric energy harvesting device of claim 1, wherein a ratio of a surface area $A_{pat}$ of the 3-dimensional pattern surface layer to a surface area $A_{sub}$ of a virtual plane of the substrate satisfies $1 < A_{pat}/A_{sub} \leq 10$, the virtual plane corresponding to a plane surface when assuming that the substrate has the plane surface instead of the 3-dimensional pattern surface layer.

6. The piezoelectric energy harvesting device of claim 1, wherein the piezoelectric material layer comprises a piezoelectric ceramic containing lead zirconate titanate (PZT, $Pb[Zr_xTi_{1-x}]O_3$, $0<x<1$), barium titanate (BTO, $BaTiO_3$), lead magnesium niobate-lead titanate (PMN-PT), lead zinc niobate-lead titanate (PZN-PT), $BaNiTiO_3$ (BNT), barium zirconate titanate-barium calcium titanate (BZT-BCT), lead magnesium niobate-lead zirconate titanate (PMN-PZT), ZnO, AlN, or a mixture thereof.

7. The piezoelectric energy harvesting device of claim 1, wherein the piezoelectric material layer comprises a piezoelectric polymer containing polyvinylidene fluoride (PVDF), polyvinylenedifluoride-tetrafluoroethylene (PVDF-TrFE), P(VDF-TrFE-CFE), P(VDF-TrFE-CTFE), electron-irradiated P(VDF-TrFE), or a mixture thereof.

8. The piezoelectric energy harvesting device of claim 7, wherein the piezoelectric material layer has a thickness from 0.1 μm to 10 μm.

9. The piezoelectric energy harvesting device of claim 1, further comprising:
a first electrode layer between the pattern surface layer and the piezoelectric material layer; and
a second electrode layer, which is disposed on the piezoelectric material layer and faces the first electrode layer.

10. The piezoelectric energy harvesting device of claim 9, further comprising a buffer layer between the pattern surface layer and the first electrode layer.

11. The piezoelectric energy harvesting device of claim 10, wherein the buffer layer comprises Ti, W, Pt, Au, Mo, Ni, $TiO_2$, Cr, or a mixture thereof.

12. The piezoelectric energy harvesting device of claim 1, wherein the 3-dimensional pattern surface layer are integrated with the substrate, or the 3-dimensional pattern surface layer are arranged on the substrate.

13. The piezoelectric energy harvesting device of claim 10, wherein the buffer layer prevents diffusion of materials of different layers between the substrate including the 3-dimensional pattern surface layer and the piezoelectric material layer.

14. The piezoelectric energy harvesting device of claim 1, wherein the piezoelectric material layer has a thickness from 0.1 μm to 10 μm.

15. A piezoelectric energy harvesting device comprising:
a substrate including a 3-dimensional pattern surface layer;
a piezoelectric material layer, which is formed on the 3-dimensional pattern surface layer and forms a 3-dimensional interface with the 3-dimensional pattern surface layer, the 3-dimensional interface being formed in a surface of the piezoelectric material layer facing to the substrate due to the 3-dimensional pattern surface layer;
an electrode layer between the 3-dimensional pattern surface layer and the piezoelectric material layer; and
a buffer layer between the 3-dimensional pattern surface layer and the electrode layer.

16. The piezoelectric energy harvesting device of claim 15, wherein the piezoelectric device has a cantilever-type structure.

17. The piezoelectric energy harvesting device of claim 15, wherein a ratio of a surface area $A_{pat}$ of the 3-dimensional pattern surface layer to a surface area $A_{sub}$ of a virtual plane of the substrate satisfies $1 < A_{pat}/A_{sub} \leq 10$, the virtual plane corresponding to a plane surface when assuming that the substrate has the plane surface instead of the 3-dimensional pattern surface layer.

18. The piezoelectric energy harvesting device of claim 15, wherein the piezoelectric material layer comprises a piezoelectric polymer containing polyvinylidene fluoride (PVDF), polyvinylenedifluoride-tetrafluoroethylene (PVDF-TrFE), P(VDF-TrFE-CFE), P(VDF-TrFE-CTFE), electron-irradiated P(VDF-TrFE), or a mixture thereof.

19. The piezoelectric energy harvesting device of claim 18, wherein the piezoelectric material layer has a thickness from 0.1 μm to 10 μm.

* * * * *